United States Patent [19]

Nagumo et al.

[11] Patent Number: 4,608,692
[45] Date of Patent: Aug. 26, 1986

[54] ERROR CORRECTION CIRCUIT

[75] Inventors: Masahide Nagumo, Kawasaki; Tadashi Kojima; Jun Inagawa, both of Yokohama, all of Japan

[73] Assignee: Kabushiki Kaisha Toshiba, Japan

[21] Appl. No.: 647,919

[22] Filed: Sep. 6, 1984

[30] Foreign Application Priority Data

Sep. 6, 1983 [JP] Japan .................................. 58-163675
Sep. 6, 1983 [JP] Japan .................................. 58-163678

[51] Int. Cl.⁴ ............................................. G06F 11/10
[52] U.S. Cl. ........................................ 371/37; 371/38; 371/39
[58] Field of Search ........................ 371/37, 38, 39, 40

[56] References Cited

U.S. PATENT DOCUMENTS 4,142,174  2/1979  Chen et al. .............................. 371/37
4,360,916 11/1982  Kustedjo .................................. 371/37
4,498,175  2/1985  Nagumo .................................. 371/37
4,509,172  4/1985  Chen ........................................ 371/38
4,556,977 12/1985  Olderdissen ............................ 371/37

Primary Examiner—Michael R. Fleming
Attorney, Agent, or Firm—Finnegan, Henderson, Farabow, Garrett & Dunner

[57] ABSTRACT

An error correction circuit in which an error location polynomial is determined on the basis of the code word of the code of a double correction BCH symbol in Galois field GF($2^m$), thereby determining the error location and error pattern necessary for the error correction. The error correction circuit includes: (a) means for generating a syndrome $S_i$ (i being an integer) from the code word: (b) first and second means for holding $S_1$ and $S_0$ out of the syndromes outputted from the syndrome generating means; (c) means for effecting the following calculation on the basis of the syndrome generated by the syndrome generating means:

$$r_3 = S_2 S_0 + S_1^2$$

$$r_2 = S_3 S_0 + S_1 S_2$$

$$r_1 = S_3 S_1 + S_2^2$$

third means for holding $r_3$ out of $r_3$, $r_2$ and $r_1$; (d) means for judging whether $r_3$ out of $r_3$, $r_2$ and $r_1$ satisfy the condition: $r_3 \neq 0$ or $r_3 = 0$; (e) a control means for making, when the condition: $r_3 \neq 0$ is confirmed by the judging means, the first and second holding means holding $r_1$ and $r_2$ in place of $S_1$ ad $S_0$; and (f) means for processing signals, which is adapted to add a value obtained through multiplying the content $S_1$ or $r_1$ of the first holding means and the content $S_0$ or $r_2$ of the second holding means by the element $\alpha^i$ of the Galois field GF($2^m$) to a value of the third holding means with $\alpha^{2i}$, whereby the element $\alpha^i$ as obtained when the output from the signal processing means is reduced to zero is used as the error location.

2 Claims, 5 Drawing Figures

ERROR CORRECTION CIRCUIT

BACKGROUND OF THE INVENTION

The present invention relates to an improvement in an error correction circuit suitable for use in a digital audio disc (referred to hereinafter as "DAD") playback apparatus for an optical compact disc (referred to hereafter as "CD").

In recent years, it has become popular in the field of acoustic technology to have digital recording systems make use of a PCM (Pulse Coded Modulation) technique in order to obtain playback with as high fidelity as possible. This kind of technique, usually referred to as a "digital audio system," exhibits audio characteristics greatly superior to that of a conventional analog type playback system since it is not dependent on the characteristics of the recording medium.

In a "DAD" system which makes use of a disc as the recording medium, various types of recording/playback methods have been proposed, such as an optical type method, electrostatic type method, and mechanical type method. These recording/playback techniques require a playback apparatus which can satisfy various functions and a high standard of performance which could never be achieved by the prior art, regardless of the type of recording and playback techniques employed.

For example, in the case of the CD system, the disc used as the medium is made of a transparent resin and has a diameter of about 12 cm and a thickness of about 1.2 mm, the disc being coated with a metallic thin film in which are formed pits corresponding to the digital PCM signal. The disc is driven by a system called the CLV (Constant Linear Velocity) system at a variable rotational speed of about 500 to 200 r.p.m. An optical pick-up housing a semiconductor laser and a photoelectric conversion element are driven by a linear tracking system so that the laser beam scans radially the disc from the inner side to the outer side of the disc. The disc usually has a track pitch of 1.6 μm and has a program area (radial range of 25 to 58 mm) which is large enough to store the information for a one-hour stereophonic playback on each side of the disc. In addition, index data and other associated data are stored in the lead-in area (radial range 23 to 25 mm).

In the DAD system of the type described, it is required to provide for an easy generation of pit synchronizing signals during playback and to realize a stable data slice by using narrow band frequency characteristics of the RF signal read by the optical pick-up. The recording of digitized data is conducted after such modulation that the interval of inversion of polarity always falls between the maximum and minimum polarity inversion interval. In case of DAD playback apparatus for an optical CD system, an EFM (Eight to Fourteen Modulation) is ordinarily used as the modulation system. Briefly, this modulation system divides the digitized data in a unit of 8-bit data and records the same after modulation to 14-bit data. In the playback, therefore, the 14-bit data is demodulated into original 8-bit digitized data. The 8-bit digitized data, produced by the demodulation of the 14-bit data reproduced from the disc, is led to an error correction circuit in which an error correcting operation is conducted.

In the optical CD type DAD playback apparatus, cross interleaved Reed-Solomon codes (referred to hereafter as "CIRC codes") are used as the error correcting codes. CIRC codes are obtained by submitting Reed-Solomon codes, which are a kind of Bose-Chaudhuri-Hocquenghem (BCH) code and are generally regarded as the most effective random error correction codes hitherto known, to a signal processing called "cross interleaving." CIRC codes thus obtained are sensitive enough to correct burst errors. Reed-Solomon codes can be decoded in the same way as other BCH codes, in order to correct errors.

A discussion will be made hereinafter as to the method of decoding typical Reed-Solomon codes consisting of k pieces of information data systems and (n-k) pieces of inspection symbols, i.e., consisting of n total pieces of symbols. It is noted here that these symbols are the elements of a Galois field GF ($2^m$) which is a definite field having m pieces of binary bits, i.e., $2^m$ elements. In this case, the generator polynomial H(x) having Reed-Solomon code for covering an error at number of times is given either by the following Equation (1) for BCH codes or (2) for Reed-Solomon codes, where α is a primitive element of Galois field GF($2^m$):

$$H(x)=(x+\alpha)(x+\alpha^2)\ldots(x+\alpha^{2t}) \quad (1)$$

$$H(x)=(x+\alpha^0)(x+\alpha)\ldots(x+\alpha^{2t-1}), \quad (2)$$

If we let U(x), V(x) and E(x) denote the recording signal polynomial, the playback signal polynomial and the error polynomial, respectively, then these polynomials satisfy the following relationship.

$$V(x)=U(x)+E(x) \quad (3)$$

The coefficients of polynomials are contained by the Galois field GF($2^m$). If we let $X_j$ denote an error location, and let $Y_j$ denote the value of the error at the error location $X_j$, the error polynomial E(x) can then be given as:

$$E(x) = \sum_j Y_j X_j \quad (4)$$

where Σ is the sum of the errors at all of the error locations.

Here, syndrome $S_i$ is defined here by:

$$S_i = V(\alpha^i) \quad (5)$$

where, i=0,1, ..., 2t−1.

Then, from equation (3) we have:

$$S_i = U(\alpha^i) + E(\alpha^i)$$

Here U(x) can be divided by H(x) without leaving a remainder. As a result, the following therefore holds true:

$$S_i = E(\alpha^i)$$

From Equation (4) it is evident that syndrome $S_i$ may be expressed as follows:

$$S_i = E(\alpha^i) = \sum_j Y_j(\alpha^j)^i \quad (6)$$

Let $X_j = \alpha^j$, $X_j$ represents the error location at $\alpha^j$. Then $$S_i = \sum_j Y_j X_j^i$$

The error location polynomial $\sigma(x)$ is defined as follows:

$$\sigma(x) = \pi(x - X_j) = x^e + \sigma_1 x^{e-1} + \ldots + \sigma_e \qquad (7)$$

where e is the number of errors. The coefficients $\sigma_1$ to $\sigma_3$ of $\sigma(x)$ are related to the error syndrome $S_i$ as shown below:

$$S_{i+e} + \sigma_i S_{i+e-1} + \ldots + \sigma_{e-1/1} S_{i+1} + \sigma_e/S_i = 0 \qquad (8)$$

Briefly, the above-explained process of decoding of the Reed-Solomon code is as follows.

(I) To calculate syndrome $S_i$ in accordance with Equation (5).

(II) To obtain coefficients $\sigma_1$ to $\sigma_3$ contained in the error location polynomial $\sigma(x)$ in accordance with Equation (8).

(III) To determine the root $X_j$ of the error location polynomial $\sigma(x)$ in accordance with Equation (7).

(IV) To determine the error polynomial $E(x)$ in accordance with Equation (4), after determining the value $Y_j$ in accordance with Equation (6).

(V) To effect an error correction in accordance with Equation (3).

By using the steps listed above, the steps needed to decode a Reed-Solomon code consisting of many block data each containing four inspection symbols will be described as a practical example of the error correction. This code is represented by the following generator polynomial $H(x)$:

$$H(x) = (x+1)(x+a)(x+a^2)(x+a^3).$$

In this case, this polynomial $H(x)$ permits the correction of error up to double error, as explained hereinafter. The Reed-Solomon code may be decoded by the following process.

(I) To calculate syndromes $S_0$ to $S_3$.

(II) Equation (8) is rewritten for each of the cases of e=1 and e=2 as follows.

In case of e=1:

$$S_1 + \sigma_1 S_0 = 0$$

$$S_2 + \sigma_1 S_1 = 0$$

$$S_3 + \sigma_1 S_2 = 0 \qquad (9)$$

In case of e=2:

$$S_2 + \sigma_1 S_1 + \sigma_2 S_0 = 0$$

$$S_3 + \sigma_1 S_2 + \sigma_2 S_1 = 0 \qquad (10)$$

It is assumed here that the actual decoder commences its operation from the state of e=1. In this case, it is necessary to determine the solution $\sigma_1$ which satisfies the simultaneous Equation (9). If no solution $\sigma_1$ is found, the decoder must find solutions $\sigma_1$ and $\sigma_2$ which satisfy the simultaneous Equation (10). In such solutions cannot be found, it is deemed that the condition of e=3 is met.

The solution $\sigma_1$ of simultaneous Equation (9) can be expressed by:

$$\sigma_1 = S_1/S_0 = S_2/S_1 = S_3/S_2$$

The solution $\sigma_1$ and $\sigma_2$ of simultaneous Equation (10) is:

$$\sigma_1 = (S_0 S_3 + S_1 S_2)/(S_1^2 + S_0 S_2), \text{ and}$$

$$\sigma_2 = (S_1 S_3 + S_2^2)/(S_1^2 + S_0 S_2)$$

(III) If the coefficient $\sigma_1$ in the error location polynomial is obtained, find the root of the error location polynomial in accordance with Equation (7).

In the case of e=1:

$$\sigma(x) = x + \sigma_1 + 0$$

Therefore, $Z_1 = \sigma_1$.

In the case of e=2:

$$\sigma(x) = x^2 + \sigma_1 x + \sigma_2 = 0 \qquad (11)$$

Substituting the elements of the Galois field $GF(2^m)$ in Equation (11) one after another will yield roots $Z_1$ and $Z_2$.

(IV) If the roots of the error location polynomial are found, determine the error value $Y_j$ in accordance with Equation (6).

In the case of e=1:

$$S_0 = Y_1$$

Therefore, $Y_1 = S_0$.

In the case of e=2:

$$S_0 = Y_1 + Y_2$$

$$S_1 = Y_1 Z_1 + Y_2 Z_2$$

Therefore, $$Y_1 = (Z_2 S_0 + S_1)/Z_1 + Z_2), \text{ and}$$

$$Y_2 = S_0 + Y_1$$

(V) The correction of the error is conducted in accordance with the correction values $Y_1$ and $Y_2$ thus obtained.

FIG. 1 is a block diagram of a conventional error correction circuit constituted by an actual decoding system of CIRC codes based on the theory heretofore described. Pick-up 11 is adapted to reproduce an RF signal from the disc. The RF signal is converted by a data slice circuit (not shown) into digitized data and is used for the extraction of the synchronizing signal for the self-locking purpose, and is given to a demodulating circuit 12. As explained before, demodulating circuit 12 carries out the EFM demodulation for converting the 14-bit data recorded in the disc into 8-bit data and delivers the demodulated symbols to the error correcting means 13.

Error correcting means 13 is a cross interleave double correction system constituted by a double correcting circuit 14, de-interleave circuit 15 and a double correction circuit 16. In operation, when the result of the error judgment in the double correction circuit 14 has proved that the error is correctable, the error correction is conducted in the manner explained before and the corrected value is delivered to a D/A converter (not shown) through de-interleave circuit 15 and double correction circuit 16. On the other hand, when the error correcting capacity is exceeded, the error correction is not performed but an error flag $E_f$ representing the error location is added to the demodulated symbols and is outputted to de-interleave circuit 15 for a de-interleave processing together with the error flag $E_f$. Then the error correction is affected by double correction circuit 16.

In the conventional error correction circuit, the coefficients $\sigma_i$ of the error location polynomial are determined by the simultaneous Equations (9) and (10) and the number of errors is judged to determine whether the error is singular, double or triple. Then the error location polynomial is selected in accordance with the error number and the root (error location) is determined. The error correction is conducted after determination of the error pattern. As stated before, the coefficients $\sigma_i$ are given as follows when the conditions of the simultaneous Equations (9) and (10) are met, respectively.

In case of Equation (9):

$$\sigma_1 = S_1/S_0 = S_2/S_1 = S_3/S_2$$

In case of Equation (10):

$$\sigma_1 = (S_0 S_3 + S_1 S_2)/(S_1^2 + S_0 S_2)$$

$$\sigma_2 = (S_1 S_3 = S_2^2)/(S_1^2 + S_0 S_2)$$

In either case, it is necessary to effect a dividing operation. As well known, dividing circuits are rather complicated although multiplying circuits can have a comparatively simple construction.

This gives rise to the demand for a simple circuit which can perform the judgment as to whether the error is a singular error, double error or a triple error.

SUMMARY OF THE INVENTION

It is an object of the present invention to provide an error correction circuit which can perform an error judgment at a high accuracy with a simple circuit arrangement.

Another object of the present invention is to provide an error correction circuit which can perform algebraic operations such as multiplication and addition on the elements of the Galois field thereby finding error locations and error patterns in a short time.

These and other objects are achieved in the error correction circuit of the present invention wherein an error location polynomial is determined on the basis of the code words of BCH codes in Galois field $GF(2^m)$, thereby determining the error location and error pattern necessary for the error correction, and which includes: means for generating a syndrome $S_i$ (i being an integer) from the code word; a first and a second means for holding $S_1$ and $S_0$ out of the syndromes outputted from the syndrome generating means; means for effecting the following calculations on the basis of the syndrome generated by the syndrome generating means, $$r_3 = S_2 S_0 = S_1^2$$

$$r_2 = S_3 S_0 + S_1 S_2$$

$$r_1 = S_3 S_1 + S_2^2;$$

a third means for holding $r_3$ out of $r_3$, $r_2$, $r_1$; means for judging whether $r_3$ out of $r_3$, $r_2$, $r_1$ satisfies the condition of $r_3 \neq 0$ or $r_3 = 0$; means for controlling the first and second holding means to hold $r_1$ and $r_2$ in place of $S_1$ and $S_0$; and a signal processing means which is adapted to add a value obtained through multiplying the content $S_1$ or $r_2$ of the first holding means and the content $S_0$ or $r_2$ of the second holding means by the element $\alpha^i$ of the Galois field $GF(2^m)$ to a value which is obtained through multiplying the content $r_3$ of the third holding means by the element $\alpha^{2i}$; whereby the element $\alpha^i$ is obtained when the output from the signal processing means is reduced to 0 is used as the error location.

Additional objects, advantages, and features of the present invention will further become apparent to persons skilled in the art from a study of the following description and of the accompanying drawings, in which:

DESCRIPTION OF THE PREFERRED EMBODIMENT

Figure 1:
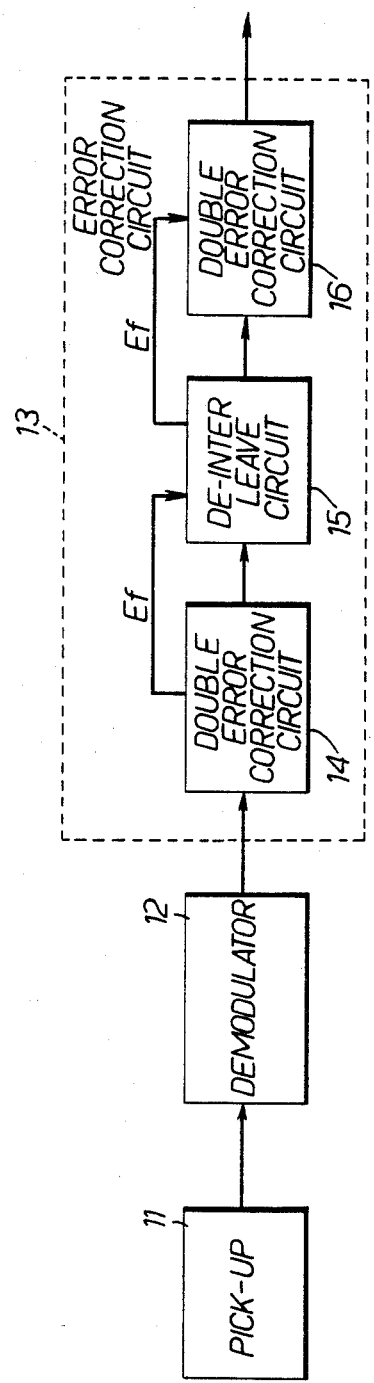
FIG. 1 is a block diagram of a prior art error correction circuit relating to the field of the invention.

The present invention will now be described in detail with reference to the accompanying drawings; FIG. 2 to FIG. 5. Throughout the drawings, like reference numerals and letters are used to designate like or equivalent elements for the sake of simplicity of explanation.

Before describing an embodiment of the present invention, an explanation will be made hereinafter as to the principle of the error judging means as used in the error correction circuit of the present invention.

By way of example, it is assumed here that the Galois field is $GF(2^8)$. It is also assumed that the generating polynomial $H(x)$ is given by:

$$H(x) = (x+1)(x+\alpha)(x+\alpha^2)(x+\alpha^3)$$

where $\alpha$ represents the root of the polynomial.

It is further assumed that the number n of the symbols of the correction blocks is 32, and that the polynomial $U(x)$ of the recording operation as expressed by the following equation is divisible by $H(x)$.

$$H(x) = U_{31}x^{31} + U_{30}x^{30} + \ldots + U_1 x^1 + U_0 x^0$$
$$= U_{31}x^{31} + U_{30}x^{30} + \ldots + U_1 x + U_0$$

In this case, the following condition is met as described before.

$$U(1) = U(\alpha) = U(\alpha^2) = U(\alpha^3) = 0.$$

The above-mentioned equation, however, is not satisfied when the error is generated in the reproducing operation. Namely, in the case where the error is singular, the syndromes $S_0$ to $S_3$ are represented as follows, when the error locations and the error patterns are expressed by $\alpha^i$ and $e_i$, respectively.

$$S_0 = e_i$$

$$S_1 = e_i \alpha^i$$

$$S_2 = e_i \alpha^{2i}$$

$$S_3 = e_i \alpha^{3i}$$

Therefore, the following simultaneous Equation (12) is established.

$$S_1 + \alpha^i S_0 = 0$$
$$S_2 + \alpha^i S_i = 0$$
$$S_3 + \alpha^i S_2 = 0 \qquad (12)$$

This simultaneous Equation (12) corresponds to simultaneous Equation (9) mentioned before. Therefore, $\alpha^0$ to $\alpha^{31}$ are successively substituted for x in the following equation:

$$S_1 + xS_0 = 0 \qquad (13)$$

and the error location is identified as the value x which provides the value 0 of the above-shown formula.

In the case where the error is a double error, the syndromes $S_0$ to $S_3$ are given as follows, when the error locations are expressed as $\alpha^a$ and $\alpha^b$ while the error patterns are represented by $e_a$ and $e_b$, respectively.

$$S_0 = e_a + e_b$$
$$S_1 = e_a \alpha^a + e_b \alpha^b$$
$$S_2 = e_a \alpha^{2a} + e_b \alpha^{2b}$$
$$S_3 = e_a \alpha^{3a} + e_b \alpha^{3b}$$

Consequently, the condition of the following simultaneous Equation (14) is met.

$$S_2 = (\alpha^a + \alpha^b) S_1 + \alpha^a \alpha^b S_0$$
$$S_3 = (\alpha^a + \alpha^b) S_2 + \alpha^a \alpha^b S_1$$

The simultaneous Equation (14) corresponds to simultaneous Equation (10).

Representing $(\alpha^a + \alpha^b)$ and $\alpha^a \alpha^b$ by A and B, respectively, the values $\alpha^a$ and $\alpha^b$ are determined as the roots of the following quadratic equation.

$$x^2 + Ax + B = 0 \qquad (15)$$

Further, the following conditions are derived from simultaneous Equation (14).

$$A = (S_1 S_2 + S_0 S_3)/(S_1^2 + S_2 S_0)$$
$$B = (S_2^2 + S_3 S_1)/(S_1^2 + S_2 S_0)$$

Using $r_1$, $r_2$ and $r_3$ meeting the requirements of the following simultaneous Equation (16):

$$S_1^2 + S_2 S_0 = r_3$$
$$S_1 S_2 + S_0 S_3 = r_2$$
$$S_2^2 + S_3 S_1 = r_1 \qquad (16)$$

Equation (15) can be rewritten as follows.

$$x^2 + (r_2/r_3)x + r_1/r_3 = 0 \text{ (where } r_3 \neq 0)$$

Since $\alpha^a$ and $\alpha^b$ are roots of the above quadratic equation, they are also the roots of the following equation.

$$r_3 x^2 + r_2 x + r_1 = 0 \qquad (17)$$

Then, $\alpha^0$ to $\alpha^{31}$ are successively substituted for x in Equation (17), and the error location is identified as the value of x which makes the value of Equation (17) zero.

Thus, in case of the singular error, $\alpha^0$ to $\alpha^{31}$ are successively substituted for the x in Equation (13) and the singular error is judged from the fact that Equation (13) has a root which can make Equation (13) equal zero. On the other hand, in the case of the double error, $\alpha^0$ to $\alpha^{31}$ are successively substituted for the x in Equation (17) and the double error is judged by the fact that Equation (17) has two roots which can make Equation (17) equal zero.

In the case of the singular error, a following equation is derived from simultaneous Equation (12).

$$S_1^2 + S_2 S_0 = S_2^2 + S_1 S_3 = S_1 S_2 + S_0 S_3 = 0$$

Comparing the above equation with simultaneous Equation (16), it is understood that the following condition is met.

$$r_3 = r_2 = r_1 = 0$$

Since when the condition $r_3 \neq 0$ is met in the case of a double error, it is judged that the error is double, triple or of higher degree. On the other hand, when the condition $r_3 = 0$ is met, it is judged that the error is singular or triple or of higher degree.

Figure 2:
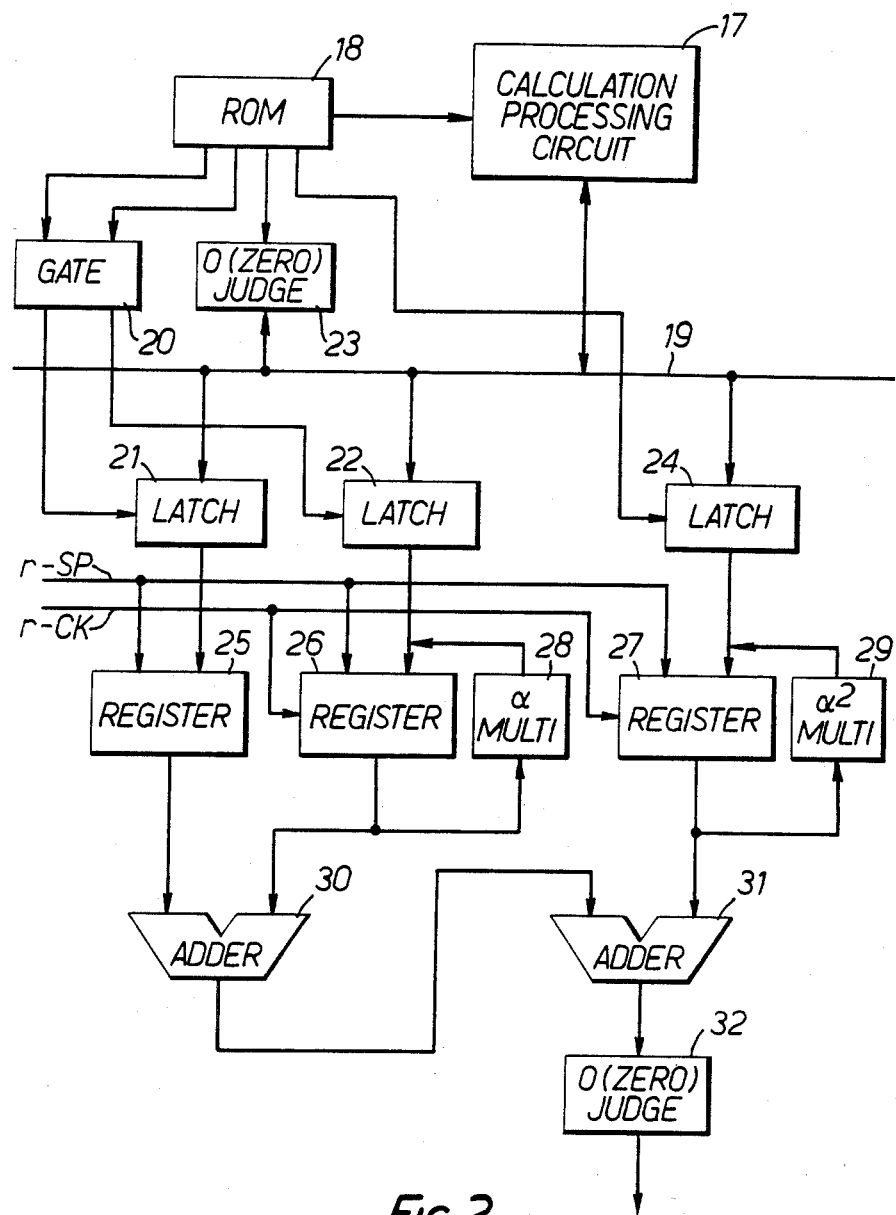
FIG. 2 is a block diagram of an embodiment of an error correction circuit constructed according to the present invention.

Referring now to FIGS. 2 to 5, an embodiment of the present invention will be described in detail based upon the principle explained hereinbefore. FIG. 2 shows a block diagram of a circuit for solving Equations (13) and (17). The operation of the circuit will be explained with reference to a flow chart shown in FIG. 3 and timing charts shown in FIGS. 4 and 5.

Figure 3:
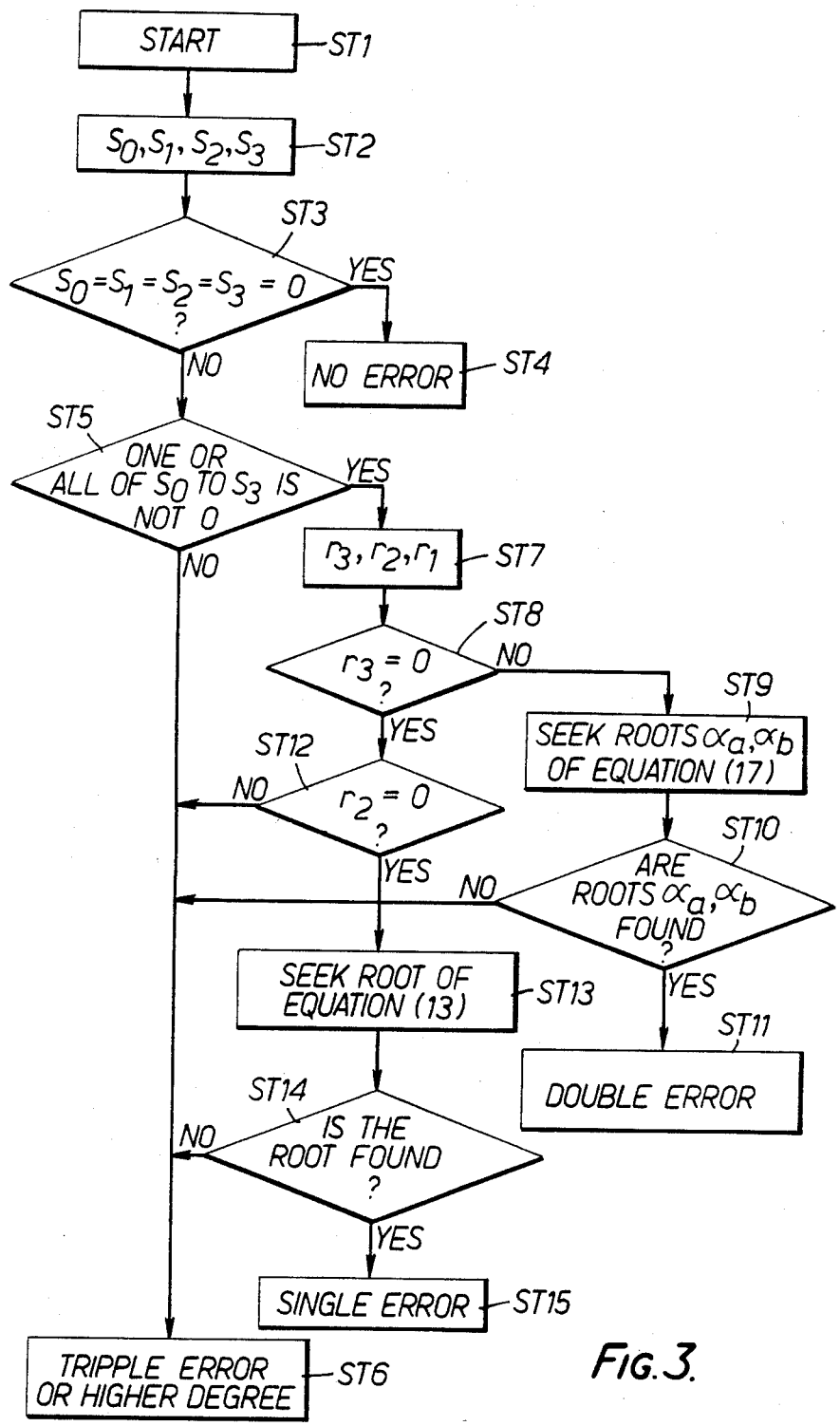
FIG. 3 is a flow chart for explaining the operation of the embodiment shown in FIG. 2.

In FIG. 2, calculation processing circuit 17 is adapted to calculate data or signals supplied from BUS line 19 in accordance with a program stored in read only memory (hereinafter referred to as ROM) 18, when operations are commenced at each step in the flow chart shown in FIG. 3. Calculation processing circuit 17 first calculates the syndromes $S_0$ to $S_3$ in a step $ST_2$. Calculation processing circuit 17 then delivers to BUS line 19 the syndrome $S_1$ out of the syndromes $S_0$ to $S_3$ thus determined. Meanwhile, gate circuit 20 controlled by ROM 18 delivers a latch signal to latch circuit 21, so that the first syndrome $S_1$ is latched in latch 21. Subsequently, calculation processing circuit 17 delivers to BUS line 19 the syndromes $S_0$ to $S_3$ thus produced. Gate circuit 20 delivers a latch signal to latch circuit 22 so that the syndrome $S_0$ is latched by latch circuit 22.

Calculation processing circuit 17 makes a judgment in step $ST_3$ as to whether all the syndromes $S_0$ to $S_3$ are zero. In cases where the answer is YES, i.e., all of the syndromes are zero, the symbols are judged as involving no error, meaning that the symbols are correct, so that the answer is outputted directly through step $ST_4$ without being subjected to the error judgment and error correction which are yet to be executed. When the answer is NO, i.e., when not all of the syndromes $S_0$ and $S_3$ are zero, calculation processing circuit 17 makes a judgement in step $ST_5$ as to whether one of the syndromes $S_0$ to $S_3$ is not zero or all of the syndromes are not zero. If the answer of this judgement is NO, a judgement is made in step $ST_6$ to decide that the present error is of a triple or higher degree.

On the other hand, if the answer to the judgement in step $ST_5$ is YES, calculation processing circuit 17 calculates the values $r_3$, $r_2$ and $r_1$ on the basis of the syndromes $S_0$ to $S_3$ in step $ST_7$. Thereafter, a judgment is made in step $ST_8$ as to whether the value $r_3$ is zero or not. The judgement in step $ST_8$ is conducted in the following manner. First, calculation processing circuit 17 delivers $r_3$ out of the values $r_3$, $r_2$ and $r_1$ thus determined to BUS line 19. Then zero judgement circuit 23, which is under the control of ROM 18, makes a judgement whether the value $r_3$ outputted to BUS line 19 is zero. Meanwhile, the value $r_3$ delivered to BUS line 19 is latched by latch circuit 24 controlled by ROM 18. Thereafter calculation processing circuit 17 operates to deliver the values $r_2$ and $r_1$ successively to BUS line 19.

An explanation will be made first with the case where the condition $r_3 \neq 0$ is met, i.e., with the case where the answer obtained in step $ST_8$ is NO. In this case, it is judged that the error is double or triple, so that a calculation for determining the root of Equation (17) is conducted in step $ST_9$. This calculation in step $ST_9$ is conducted in a manner explained hereinafter. When the condition $r_3 \neq 0$ is confirmed, zero judging circuit 23 operates to drive gate circuit 20 whereby latch signals are delivered to latch circuits 22 and 21 at such timing that the signals $r_3$ and $r_2$ are derived from calculation processing circuit 17. Therefore, latch circuits 22 and 21 latch the values $r_2$ and $r_1$ instead of the syndromes $S_0$ and $S_1$.

After the latching of the signals $r_1$, $r_2$ and $r_3$ in respective latch circuits 21, 22, 24, set signals r-SP are given to register circuits 25, 26, 27 which are provided to correspond to respective latch circuits 21, 22, 24, so that the signals $r_1$, $r_2$, $r_3$ latched in latch circuits 21, 22, 24 are shifted to register circuits 25, 26, 27.

Register circuit 26 is connected to multiplier circuit 28 which is adapted to operate in response to multiplication clock signal r-CK so as to multiply the content, i.e., the value $r_2$ of register circuit 26 by the error location $\alpha^i$ (in this case, $\alpha^i$ being $\alpha^0$ to $\alpha^{31}$) and to set the product in register circuit 26 again. On the other hand, register circuit 27 is connected to multiplier circuit 29 which operates in response to the multiplication clock signal r-CK to multiply the content, i.e., the value $r_3$ of register circuit 27 by $\alpha^2$ and to set the product again in register circuit 27.

The outputs from register circuits 25 and 26, obtained for the successive values $\alpha^0$ to $\alpha^{31}$ are added by adder 30, and the results of the addition are further added to the output from register circuit 27 by adder 31. Consequently, adder 31 produces an output which is the result of a series of calculations as shown below.

$$r_3(\alpha^0)^2 + r_2(\alpha^0) + r_1$$
$$r_3(\alpha^1)^2 + r_2(\alpha^1) + r_1$$
$$\vdots$$
$$r_3(\alpha^{31})^2 + r_2(\alpha^{31}) + r_1$$

The values $\alpha$ which makes the result of the calculation zero, i.e., 0 is the root of Equation (17), i.e., the error locations $\alpha^i$ and $\alpha^j$. Consequently, a calculation for determining the root of Equation (17) is conducted. After this calculation, a judgment is made in step $ST_{10}$ as to whether two roots have been determined. This judgment is conducted by leading the output of adder 31 to zero judging circuit 32 and judging whether the answer 0 is twice obtained. In case two roots are obtained, i.e., when the answer is YES, it is judged in Step $ST_{11}$ that the error is a double error; whereas, when two roots could not be obtained, i.e., when the answer is NO, it is judged in step $ST_6$ as a triple or higher degree error.

In the case where the condition of $r_3=0$, i.e., when the answer is YES, the operation is as follows. In this case, since the error is judged to be singular or triple or of higher degree, a judgment is made in zero judging circuit 23 as to whether $r_2$ is zero in step $ST_{12}$. In the case where $r_2 \neq 0$, a judgment is made in step $ST_6$ that the error is triple or of higher degree. To the contrary, in the case of $r_2=0$, a calculation is conducted in step $ST_{13}$ is determine the root of Equation (13). This calculation is conducted in a manner explained hereinafter.

When the condition of $r_3=0$ is confirmed as a result of the judgment in zero judging circuit 23, zero judging circuit 23 operates to prohibit operation of gate circuit 20. Therefore, the values $r_1$ and $r_2$ outputted from calculation processing circuit 17 are not latched in latch circuits 21, 22 so that latch circuits 21, 22 hold the syndromes $S_1$ and $S_0$. Then, as stated before, the contents, i.e., the values $S_1$ and $S_0$ of latch circuits 21, 22 are shifted to register circuits 25, 26, and the content $S_0$ of register circuit 26 is multiplied by the error locations $\alpha$. The content $r_3$ of latch circuit 24 is shifted to register 27 and is multiplied by $\alpha^2$. Since the condition $r_3=0$ is met in this case, the output from register 27 is zero. Thus, adder 31 produces an output which is obtained by a series of calculations shown below.

$$S_1 + S_0(\alpha^0)$$
$$S_1 + S_0(\alpha^1)$$
$$\vdots$$
$$S_1 + S_0(\alpha^{31})$$

The value of $\alpha$ which makes the calculation result zero: 0 is the root of Equation (13), i.e., the error location $\alpha^i$. Thus, the calculation for determining the root of Equation (13) is accomplished, a judgment is made in step $ST_{14}$ as to whether one root for Equation (13) has been obtained. This is made through judging whether zero judging circuit 32 once produced an output: 0. In the case where one root has been obtained, i.e., in the case where the answer is YES, it is judged in step $ST_{15}$ that the error is of singular error. To the contrary, when the root could not be determined, the answer is triple or a higher degree error.

Figure 4:
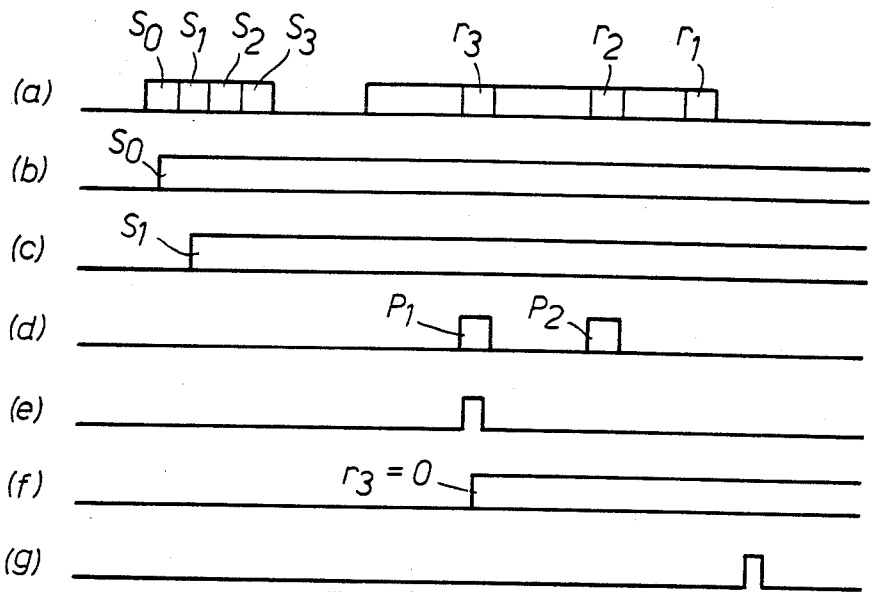
FIGS. 4a–g and 5a–g are timing charts for explaining the operation of the embodiment shown in FIG. 2.
Figure 5:
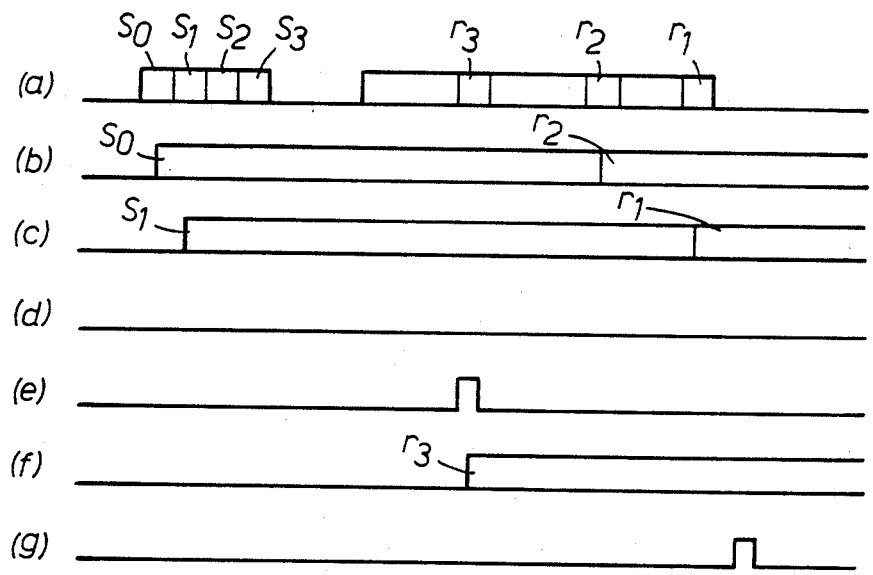

FIGS. 4 and 5 are timing charts showing the operation in the cases of $r_3=0$ and $r_3 \neq 0$, respectively. Referring first to the case $r_3=0$, when the syndromes $S_0$ to $S_3$ are outputted from calculation processing circuit 17 at the timing shown in FIG. 4a, latch circuit 22 latches $S_0$ at the timing shown in FIG. 4b, while latch circuit 21 latches at the timing shown in FIG. 4c.

Subsequently, when the signals $r_3$ and $r_1$ are outputted from calculation processing circuit 17 at the timing shown in FIG. 4a, zero judging circuit 23 outputs a judging pulse P1 for the condition $r_3=0$ at a timing shown in FIG. 4d so as to make inactive gate circuit 20 thereby to prevent latching of the signals $r_2$ and $r_1$ by latch circuits 22, 21.

Meanwhile, ROM 18 delivers a latch signal to latch circuit 24 at the timing shown in FIG. 4e, so that latch circuit 24 latches the condition $r_3=0$ at a timing as shown in FIG. 4f. Thereafter, if the condition: $r_2=0$ is met, zero judging circuit 23 delivers a judging pulse $P_2$ for the condition: $r_2=0$ at a timing shown in FIG. 4d.

After the calculation of the judgment of the condition $r_2=0$ following the latching operation of all latch circuits 21, 22, 24, a set signal r-SP is conducted at a timing as shown in FIG. 4g, so as to permit the calculation for determining the root of Equation (13).

In the event of the condition $r_3=0$, when the syndromes $S_0$ to $S_3$ are outputted at a timing shown in FIG. 5a, latch circuit 22 latches $S_0$ at the timing shown in FIG. 5b, while latch circuit 21 latches $S_1$ at the timing shown in FIG. 5c. Then, as calculation processing circuit 17 outputs the signals $r_3$ to $r_1$ at the timings shown in FIG. 5d, the judging pulse P1 for the condition $r_3 \neq 0$ is not delivered by zero judging circuit 23 because the condition is such that gate circuit 20 is allowed to operate, thereby allowing latch circuits 22, 21, to latch subsequent signals $r_2$ and $r_1$. In this case, ROM 18 produces latch signals at the timing shown in FIG. 5e, while latch circuit 24 latches $r_3$ at the timing as shown in FIG. 5f. Thereafter, when calculation processing circuit 17 delivers $r_2$ and $r_1$, latch circuits 22, 21 latch the signals $r_2$ and $r_1$ in place of the syndromes $S_0$ and $S_1$.

After the completion of the latching operation of all latch circuits 21, 22, 24, a set signal r-SP is outputted at a timing shown in FIG. 5g, followed by a calculation for determining the root of Equation (17).

To sum up, the operations of the described embodiment is as follows.

As the first step, a calculation is conducted in accordance with the following equations:

$$r_3 = S_1^2 + S_2 S_0$$

$$r_2 = S_1 S_2 + S_0 S_3$$

$$r_1 = S_2^2 + S_3 S_1$$

When the condition $r_3 \neq 0$ is met, a calculation is made to determine the roots of the following equation.

$$r_3 x^2 + r_2 x + r_3 = 0$$

When two roots are obtained, it is judged that the error is a double error and these two roots are regarded as being error locations $\alpha^i$ and $\alpha^j$. When two roots could not be obtained, it is judged that the error is a triple or higher degree error.

When the condition $r_3 = 0$ is met, a calculation is conducted to determine the root of the following equation under the condition: $r_2 = 0$.

$$S_1 + x S_0 = 0$$

If one root could be obtained at the above equation, it is judged that the present error is singular and the root is regarded as being the error locations $\alpha^i$. In case of the condition $r_2 \neq 0$ or when the root could not be obtained, it is judged that the error is triple or of higher degree. It is, therefore, possible to discriminate the singular error and double error by use of only the multiplication operation and the addition operation, so that it is not necessary to effect the dividing operation which is indispensable in the conventional system. Consequently, the circuit arrangement is simplified and error judgment is conducted without failure.

In the case of a double error, the error locations $\alpha^i$ and $\alpha^j$ are determined by using Equation (17) as the polynomial. The necessity of a dividing operation is eliminated also in this case, so that the simplification of the circuit arrangement is achieved also in this respect.

To the contrary, the conventional apparatus requires dividing circuits for determining the coefficients $\sigma_1$ and $\sigma_2$, because the aforementioned Equation (11) as the error location polynomial had been operated under the following equation.

$$\sigma(x) = x^2 = \sigma_1 x + \sigma_2$$
$$= x^2 + [(S_0 S_3 + S_1 S_2)/(S_1^2 + S_0 S_2)] x + (S_1 S_3 + S_2^2)/(S_1^2 + S_0 S_2)$$

That is, calculations for determining the coefficients $\sigma_1$ and $\sigma_2$ had to be made through the dividing operations.

According to the present invention, Equation (13) is conducted with the syndromes $S_1$ and $S_0$ latched by latch circuits 21, 22. On the other hand, if the condition $r_3 \neq 0$ is met, $r_1$ and $r_2$ are latched in place of the syndromes $S_1$ and $S_0$ to perform the calculation of Equation (17). Thus, the parts such at latch circuits 21, 22, register circuits 25, 26, multiplier circuit 28 and adder 30 are commonly used for the error location calculation for the double error. This also contributes to simplification of the circuit arrangement and shortening the processing time.

Furthermore, if the condition $r_3 = 0$ is met, the syndromes $S_1$ and $S_0$ latched by latch circuit 21, 22 remain latched by these circuits and the calculation of Equation (13) is executed. However, when the condition: $r_3 \neq 0$ is met, the calculation of equation (17) is executed with the values $r_1$ and $r_2$ latched in place of the syndromes $S_1$ and $S_0$. Consequently, the parts such as latch circuits 21, 22, register circuits 25, 26, multiplier circuit 28 and adder 30 can be used commonly both for the calculation of the error location for singular error and the calculation of the error location for the double error. This constitutes one of the advantageous features of the present invention.

After determination of the root of Equation (13) in step $ST_{14}$, a judgment is made in step $ST_{14}$ as to whether one root has been determined. When one root has been obtained, it is judged that the error is a singular error, whereas, when one root could not be obtained, it is judged that the error is triple or of higher degree. It is, therefore, possible to prevent any erroneous judgment of the singular error with a high accuracy. Namely, when an error which is quadruple is erroneously judged as a singular error, the one root may not be obtained because of the conditions $r_3 = 0$ and $r_2 = 0$ being met. In the case where the number n of symbols of the correcting block 32, while the Galois field $GF(2^8)$, the probability of the erroneous judgment of the quadruple error or error of higher degree for singular error can be nullified advantageously.

Although the present invention has been described through specific terms, it is to be noted here that the described embodiment is not exclusive and various changes and modifications may be imparted thereto without departing from the scope of the invention.

What is claimed is:

1. An error correction circuit for detecting and correcting a plurality of errors in codewords made up of k data and n−k inspection symbols in the playback data from a recorded medium each symbol made up of m binary bits of information using a Reed-Solomon code for error detection and correction so that the error location polynomial $\sigma(x)=x^e+\sigma_1 x^{-1}+ \ldots +\sigma_e$ where e is the number of errors and the coefficients $\sigma_1$ to $\sigma_e$ of the error location polynomial $\sigma(x)$ are related to the error syndromes $S_i$ generated by the error correction circuit by the equation:

$$S_{i+e}+\sigma_1 S_{i+e-1}+ \ldots \sigma_{e-1}S_{i+1}+\sigma_3 S_i=0$$

where the syndromes $S_{i+e}$ to $S_i$ are field elements $\alpha^i$ of the Galois field $GF(2^m)$, the error correction circuit comprising: means for generating syndromes $S_0$, $S_1$, $S_2$ and $S_3$ from the codewords;
  means for effecting the following three calculations on the basis of the syndromes $S_0$, $S_1$, $S_2$ and $S_3$ generated by said syndrome generating means:

$$S_2 S_0+S_1^2=r_3$$

$$S_3 S_0+S_1 S_2=r_2$$

$$S_3 S_1+S_2^2=r_1$$

where $r_3$, $r_2$ and $r_1$ represent the values of the respective calculations;
  means for judging whether the condition $r_3 \neq 0$ or $r_3=0$;
  a first processing means for finding error locations by determining the roots of the following equation as the error location polynomial, when the condition $r_3 \neq 0$ is confirmed in said judging means:

$$r_3 x^2+r_2 x+r_1=0$$

where x represents the error locations; and
  a second processing means for finding error location by determining the root of the following equation as the error location polynomial, when the condition $r_3=0$ is confirmed in said judging means under the condition of $r_2=0$:

$$S_1+S_0 x=0.$$

2. An error correction circuit for detecting and correcting a plurality of errors in codewords made up of k data and $n-k$ inspection symbols in the playback data from a recorded medium each symbol made up of m binary bits of information using a Reed-Solomon code for error detection and correction so that the error location polynomial $\sigma(x)=x^e+\sigma_1 x^{e-1}+ \ldots +\sigma_e$ where e is the number of errors and the coefficients $\sigma_1$ to $\sigma_e$ of the error location polynomial $\sigma(x)$ are related to the error syndromes $S_i$ generated by the error correction circuit by the equation:

$$S_{i+e}+\sigma_1 S_{i+e-1}+ \ldots \sigma_{e-1}S_{i+1}+\sigma_e S_i=0$$

where the syndromes $S_{i+e}$ to $S_i$ are field elements $\alpha^i$ of the Galois field $GF(2^m)$, the error correction circuit comprising:
  means for generating syndromes $S_0$, $S_1$, $S_2$ and $S_3$ from the codewords;
  first and second means for holding the syndromes $S_1$ and $S_0$,
  means for effecting the following three calculations of the basis of the syndromes $S_0$, $S_1$, $S_2$ and $S_3$ generated by said syndrome generating means:

$$S_2 S_0+S_1^2=r_3$$

$$S_3 S_0+S_1 S_2=r_2$$

$$S_3 S_1+S_2^2=r_1$$

where $r_3$, $r_2$ and $r_1$ represent the values of the respective calculations;
  third means for holding the value $r_3$;
  means for judging whether the condition $r_3 \neq 0$ or $r_3=0$;
  control means for replacing, when the condition $r_3 \neq 0$ is determined by said judging means, the syndromes $S_1$ and $S_0$ with the values $r_1$ and $r_2$ in said first and second holding means; and
  processing means for finding error locations by determining the roots of the following equations as the error locations polynomials:

$$r_3 x^2+r_2 x+r_1=0 \text{ or}$$

$$S_1+S_0 x=0$$

where x represents the error locations, said processing means being adapted to add a value obtained through adding the content of said first holding means, the syndrome $S_1$ or the value $r_1$, to the content of said second holding means, the syndrome $S_0$ or the value $r_2$, after the content of said second holding means has been multiplied by an element $\alpha$ of said Galois field $GF(2^m)$, to a value obtained from said third holding means after the content of said third holding means has been multiplied by the element $\alpha^2$, whereby each element $\alpha$ obtained when the output from said processing means is reduced to zero is used as an error location.

* * * * *